(12) United States Patent
Rosenzweig et al.

(10) Patent No.: US 11,391,768 B2
(45) Date of Patent: Jul. 19, 2022

(54) LOCALIZING BREAKDOWN IN A HIGH POWER RF NETWORK

(71) Applicant: THE REGENTS OF THE UNIVERSITY OF CALIFORNIA, Oakland, CA (US)

(72) Inventors: James Rosenzweig, Los Angeles, CA (US); Nathan Majernik, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 449 days.

(21) Appl. No.: 16/520,303

(22) Filed: Jul. 23, 2019

(65) Prior Publication Data

US 2020/0379028 A1    Dec. 3, 2020

Related U.S. Application Data

(63) Continuation of application No. PCT/US2018/012058, filed on Jan. 2, 2018.

(Continued)

(51) Int. Cl.
 *G01R 31/12* (2020.01)
 *G01R 31/08* (2020.01)

(52) U.S. Cl.
 CPC ..... *G01R 31/1209* (2013.01); *G01R 31/1272* (2013.01)

(58) Field of Classification Search
 CPC .............. G01R 31/1209; G01R 31/1272; G01R 27/06; G06F 3/0436; G01S 7/4865;
 G01S 15/8909; G01S 15/8913; G01S 15/8925; G01S 15/8927; H01P 1/39; H01P 3/00; H01P 3/02; H01P 5/024; H01P 5/00;

(Continued)

(56) References Cited

U.S. PATENT DOCUMENTS 3,191,046 A   6/1965   Savalli
3,262,515 A   7/1966   Drum
 (Continued)

FOREIGN PATENT DOCUMENTS

WO   2016162880   10/2016
WO   2018140196   8/2018

OTHER PUBLICATIONS

ISA/US, United States Patent and Trademark Office, International Search Report and Written Opinion dated Mar. 22, 2018, related PCT international application No. PCT/US2018/012058, pp. 1-10, claims searched, pp. 11-15.

*Primary Examiner* — Daniel R Miller
*Assistant Examiner* — Eric Sebastian Von Wald
(74) *Attorney, Agent, or Firm* — O'Banion & Ritchey LLP; John P. O'Banion

(57) ABSTRACT

An apparatus and method for in-situ determination of arc location within a radio-frequency (RF) waveguide. At least one pair of sound vibration transducers are coupled to positions within the waveguide from which data is collected. When a threshold level of voltage standing wave ratio (VSWR) is exceeded, then transducer data is processed to determine time-of-flight (TOF), to then compare data between transducers, to identify the faster longitudinal component with speed of sound in the material of the waveguide, from which longitudinal position information about the arc is generated.

8 Claims, 2 Drawing Sheets

Related U.S. Application Data

(60) Provisional application No. 62/449,760, filed on Jan. 24, 2017.

(58) Field of Classification Search
CPC .. H01P 5/12; H01H 71/127; H01H 2083/201; G10H 2220/525; G01N 29/2437; G01D 5/185; G04F 5/06; G08C 2201/112; H01J 2225/72; H01J 25/72; H04B 1/0466; H04B 1/0483
See application file for complete search history.

(56) References Cited

U.S. PATENT DOCUMENTS

| | | | |
|---|---|---|---|
| 3,548,260 A | 12/1970 | Krause | |
| 4,316,139 A | 2/1982 | Root | |
| 5,185,686 A * | 2/1993 | Hansen | H02H 1/0015 361/45 |
| 8,483,007 B2 * | 7/2013 | Zhou | G01R 31/1272 367/13 |
| 8,686,910 B1 | 4/2014 | Ives | |
| 2008/0021324 A1 * | 1/2008 | Seto | G01S 7/5208 600/447 |
| 2010/0231236 A1 | 9/2010 | Harrison | |
| 2012/0273191 A1 | 11/2012 | Schmidt | |
| 2014/0239969 A1 * | 8/2014 | Lebreton | G01S 5/00 324/536 |
| 2018/0032211 A1 | 2/2018 | King | |

* cited by examiner

LOCALIZING BREAKDOWN IN A HIGH POWER RF NETWORK

CROSS-REFERENCE TO RELATED APPLICATIONS

This application claims priority to, and is a 35 U.S.C. § 111(a) continuation of, PCT international application number PCT/US2018/012058 filed on Jan. 2, 2018, incorporated herein by reference in its entirety, which claims priority to, and the benefit of, U.S. provisional patent application Ser. No. 62/449,760 filed on Jan. 24, 2017, incorporated herein by reference in its entirety. Priority is claimed to each of the foregoing applications.

The above-referenced PCT international application was published as PCT International Publication No. WO 2018/140196 on Aug. 2, 2018, which publication is incorporated herein by reference in its entirety.

STATEMENT REGARDING FEDERALLY SPONSORED RESEARCH OR DEVELOPMENT

This invention was made with government support under Grant Number 1642502, awarded by the National Science Foundation. The government has certain rights in the invention.

INCORPORATION-BY-REFERENCE OF COMPUTER PROGRAM APPENDIX

Not Applicable

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to locating arc breakdowns in high power RF networks, and more particularly to utilizing multiple piezo sensors for locating arc in high-power RF networks.

2. Background Discussion

High power RF networks can suffer from internal arcing due to excessive electric fields. Such arcs are highly undesirable since the conducting plasma of the arc can reflect RF power, potentially damaging the amplifier driving the network or other parts suddenly experiencing unexpected field.

Detecting that an arc has occurred is straightforward; the reflections will trigger a VSWR condition (voltage standing wave ratio) due to a sudden impedance mismatch. At this point, the amplifier will shut down to prevent damage. Merely knowing that a breakdown is occurring is only the first step in repairing it though; the location of the arc is needed.

Localizing the arc is a more difficult problem for a number of reasons. (1) Waveguides are opaque, making external visual inspection impossible. (2) Waveguides are explicitly intended to contain electric fields, making external detection by EM sensors impossible. (3) Since waveguides are metal, sound travels freely through them, making it difficult to identify the exact location of the noise associated with the arc. (4) RF networks are expensive and extremely time consuming to disassemble and reassemble, making an exhaustive search for arc evidence undesirable. (5) Adding components to the network can be undesirable as the waveguide vacuum or gas pressurization must be released to do so. Restoring the vacuum can take hours to days depending on the network parameters.

Existing technologies either do not allow in-situ measurements which can be taken with the network intact and unchanged to take the measurements. Typically in figuring out the arc location the waveguide vacuum must be broken and components must be added, or the arc cannot be localized in any system more complicated than a straight waveguide.

Accordingly, a need exists for an apparatus and method for in-situ arc locating. The present disclosure fulfills that need and provides additional benefits over previous technologies.

BRIEF SUMMARY

An apparatus and method are described for localizing an arc inside an RF waveguide. In at least one embodiment, multiple sound vibration (acoustic) transducers, such as piezoelectric transducers, are utilized to localize arcing inside the RF waveguide based on acoustic time-of-flight and vibrational mode discrimination.

In an example embodiment, four piezoelectric transducers are used which allow distinguishing transverse versus longitudinal sound waves, giving angular position of the arc. The ability to resolve different vibrational modes also allows arcs to be localized in more complicated RF networks due to the different speeds of the modes.

Further aspects of the technology described herein will be brought out in the following portions of the specification, wherein the detailed description is for the purpose of fully disclosing preferred embodiments of the technology without placing limitations thereon.

BRIEF DESCRIPTION OF THE SEVERAL VIEWS OF THE DRAWING(S)

The technology described herein will be more fully understood by reference to the following drawings which are for illustrative purposes only:

DETAILED DESCRIPTION

1. Arc Locating Embodiment

In the presented technology, multiple piezoelectric transducers are utilized to localize arcing inside an RF waveguide based on the time it takes for the sound from an arc to travel through the waveguide. By way of example and not limitation, in one embodiment four transducers (two pairs) are used to detect the arc sound, and measurement is triggered by a Voltage Standing Wave Ratio (VSWR) condition. The use of four transducers allows distinguishing the transverse versus longitudinal sound waves of a breakdown "ping" sound.

This capability to distinguish transverse versus longitudinal sound waves is less important in straight waveguide sections since only one or the other mode will dominate (depending on transducer and arc locations). However, in a network that includes bends and other elements (e.g., gaskets) the modes will be mixed.

Since the speed of sound in the waveguide material (most often copper or aluminum) varies by nearly a factor of two depending on vibration direction, for a time of flight measurement to be meaningful, the operator can benefit greatly by being able to identify the mode being detected.

Figure 1:
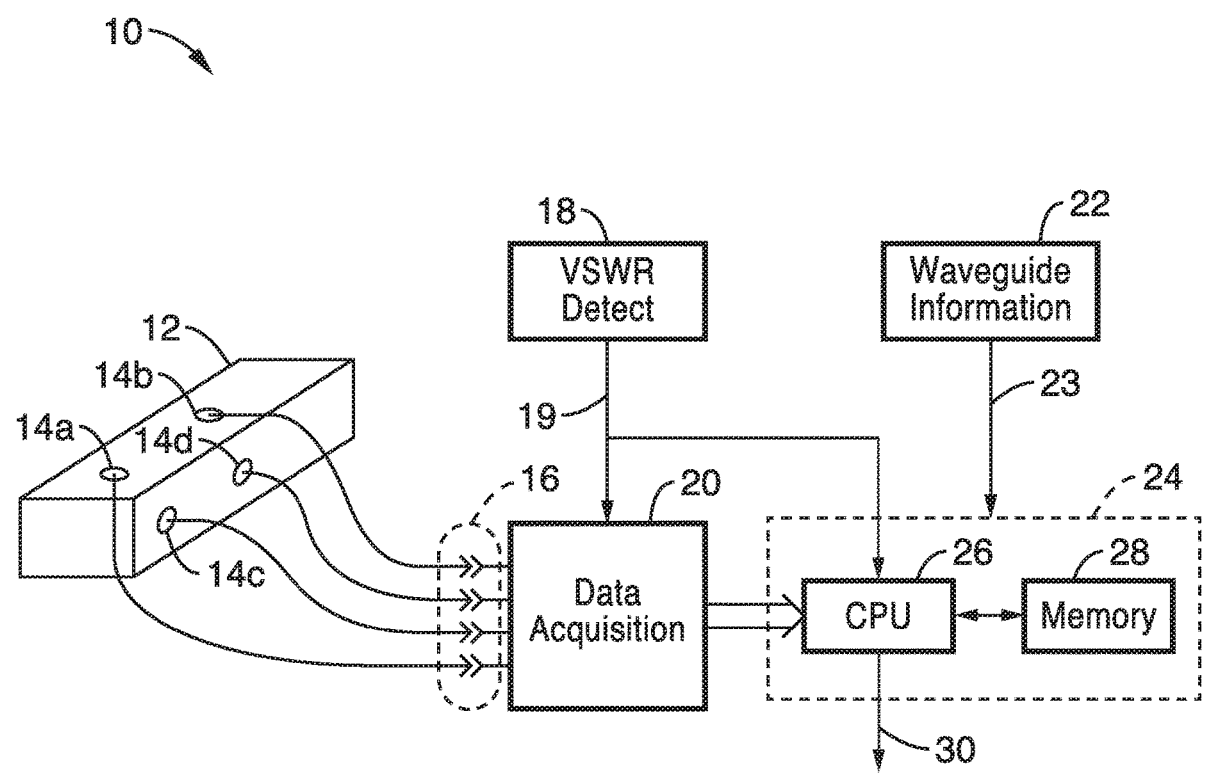
FIG. 1 is a block diagram of localizing breakdown in a high-power RF network according to an embodiment of the present disclosure.

FIG. 1 illustrates an example embodiment 10 of an arc localizing apparatus within a waveguide 14. In the figure multiple sound vibration transducers (e.g., piezo-electric transducers) 14a, 14b, 14c, 14d, are coupled to a section 12 of waveguide. In at least one preferred embodiment, the transducers are placed, in pairs, on either side of the waveguide in the general area where suspected arcing can occur. In each pair of transducers, one transducer preferably is placed at the center of one face of the waveguide and the other transducer preferably is placed on the center of the other face of the waveguide at the same longitudinal position. By pairing the transducers and placing them on perpendicular faces of the waveguide, both the fast longitudinal and slower transverse vibrational modes can be detected, regardless of the (angular) location of the arc. Since waveguides are most commonly made of aluminum or copper, the speed of these two different modes can vary by nearly a factor of two.

Waveguide 12 is shown as straight only for the sake of simplified example, although it may comprise any desired waveguide configuration. It should be appreciated that the more sections that an RF waveguide contains the more pairs of sound vibrations transducers would be required for isolating the arc sound along the extent of the waveguide. The inputs 16 from sound vibration transducers 14a, 14b, 14c and 14d are seen received by a data acquisition circuit 20, which is triggered to search for arc location in response to a VSWR detection input 19 from a VSWR detect circuit 18. The collected data is processed by a processing circuit 24, depicted as a computer processor 26 and memory 28, which operate in response to waveguide information 22 to generate information 30 on arc location in the waveguide.

Figure 2:
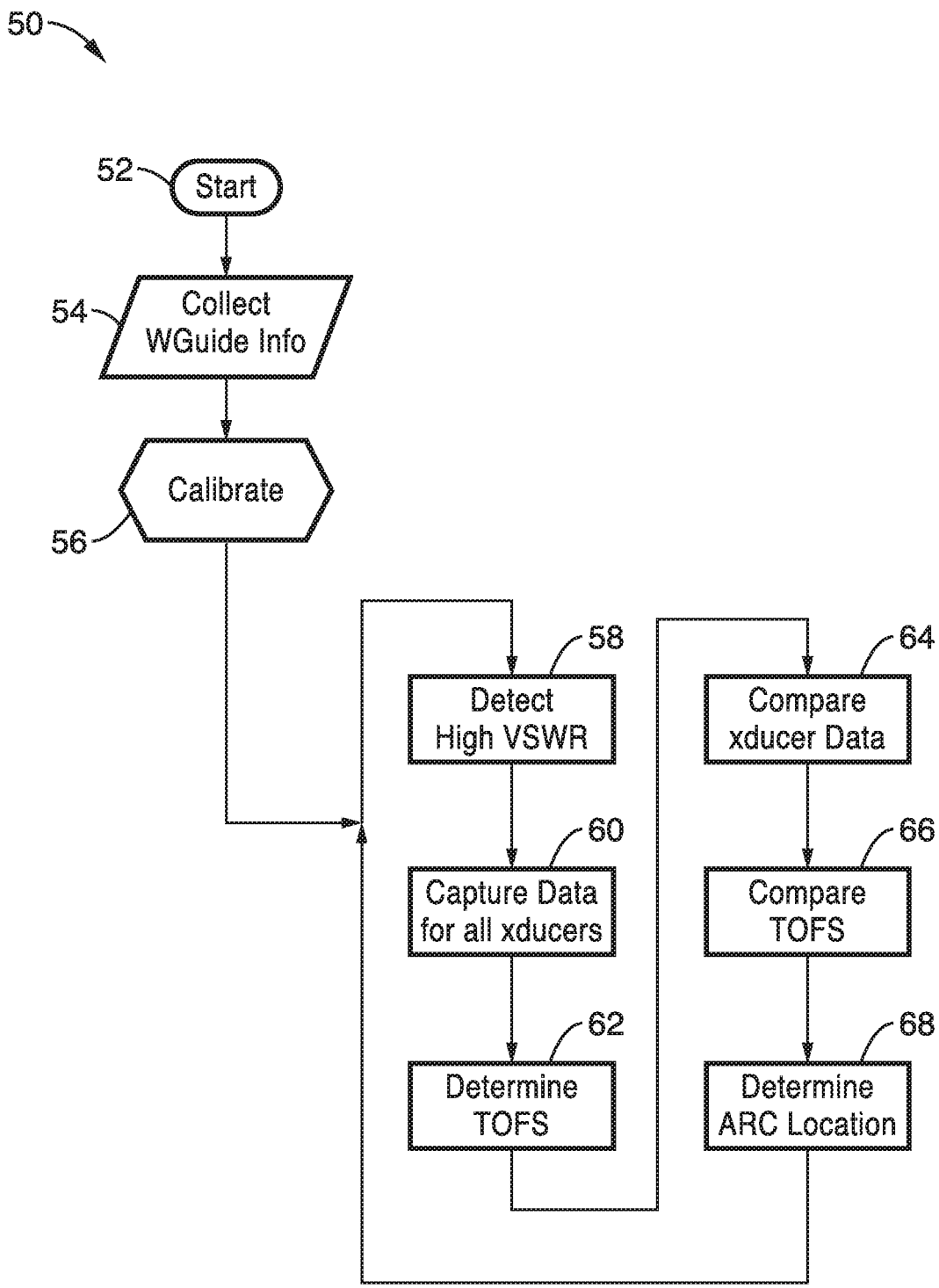
FIG. 2 is a flow diagram of steps in localizing breakdown in a high-power RF network according to an embodiment of the present disclosure.

FIG. 2 illustrates an example embodiment 50 of localizing an arc in a high power RF network with directional power measurement (e.g., crystal detectors). The process starts 52 with information being collected about the specific waveguide into which the sound vibration transducers are placed and a calibration process is performed 56 making use of the waveguide information to create a set of baseline information for use when assessing arc location when the network is operating.

During operation of the high-power RF network, a high VSWR condition is detected 58, which triggers capture 60 and processing 62, 64, 66 from the sound vibration transducers which is processed 68 to determine arc location and generate an output.

In at least one embodiment, sound vibration from the transducers is being continually monitored and stored in a buffer, with the receipt of the high VSWR signal providing a trigger to start processing of the information. This embodiment benefits from being able to analyze conditions prior to receipt of the high VSWR condition, which it should be appreciated is received some period of time after actual event occurrence.

It should be noted that in testing the concept we have been able to view readings of the transducers on an oscilloscope in response to a VSWR trigger. It should be appreciated that any data acquisition device (DAQ), directional coupler, or other device capable of detecting VSWR, can be utilized for detecting the characteristic high VSWR condition produced by an arc and collecting the sound vibration signals.

To generate arc time location a determination is made 62 for time-of-flight (TOF) for each of the multiple transducers. In each transducer pair, the first signal to arrive will be the longitudinal mode, indicating the angular position of the arcing. By having two pairs of transducers, more complex networks (e.g., networks with gaskets such that the speed of sound is not constant) can also be probed by using a style of binary search; moving the pairs closer together to find the arc as precisely as required.

Comparisons are performed 64 on the data from each sound vibration transducer pair, and from that comparison identifying the faster longitudinal component and recording the time required for the sound to reach the transducer pair. Then the respective times of flight are compared 66, based on speed of sound in the waveguide material. From the comparison of TOFs, a determination 68 is then made identifying the longitudinal position of the arc.

It should be appreciated that the transducer configuration shown in FIG. 1 was shown by way of example only, and that more complex transducer configurations can be utilized. In addition, it will be noted that in the example of FIG. 1 the transducers were held into the waveguide using only adhesive tape material, and provided sufficient acoustical coupling to the waveguide, although any desired structure may be utilized for retaining the transducers without departing from the teachings of the present disclosure. By way of example and not limitation, the example of FIG. 1 was constructed using Murata™ 7BB-20-6L0, 6.3 KHz resonance, piezoelectric diaphragms which were found to have adequate sensitivity and other characteristics for isolating the arc location.

2. General Scope of Embodiments

The enhancements described in the presented technology can be readily implemented within various sound vibration data collection and processing circuits, which in at least one embodiment are preferably implemented to include one or more computer processor devices (e.g., CPU, microprocessor, microcontroller, computer enabled ASIC, etc.) and associated memory storing instructions (e.g., RAM, DRAM, NVRAM, FLASH, computer readable media, etc.) whereby programming (instructions) stored in the memory are executed on the processor to perform the steps of the various process methods described herein. The presented technology is non-limiting with regard to memory and computer-readable media, insofar as these are non-transitory, and thus not constituting a transitory electronic signal.

Embodiments of the present technology may be described herein with reference to flowchart illustrations of methods and systems according to embodiments of the technology, and/or procedures, algorithms, steps, operations, formulae, or other computational depictions, which may also be implemented as computer program products. In this regard, each block or step of a flowchart, and combinations of blocks (and/or steps) in a flowchart, as well as any procedure, algorithm, step, operation, formula, or computational depiction can be implemented by various means, such as hardware, firmware, and/or software including one or more computer program instructions embodied in computer-readable program code. As will be appreciated, any such computer program instructions may be executed by one or more computer processors, including without limitation a general purpose computer or special purpose computer, or other programmable processing apparatus to produce a machine, such that the computer program instructions which execute on the computer processor(s) or other programmable processing apparatus create means for implementing the function(s) specified.

Accordingly, blocks of the flowcharts, and procedures, algorithms, steps, operations, formulae, or computational depictions described herein support combinations of means for performing the specified function(s), combinations of steps for performing the specified function(s), and computer program instructions, such as embodied in computer-readable program code logic means, for performing the specified function(s). It will also be understood that each block of the flowchart illustrations, as well as any procedures, algorithms, steps, operations, formulae, or computational depictions and combinations thereof described herein, can be implemented by special purpose hardware-based computer systems which perform the specified function(s) or step(s), or combinations of special purpose hardware and computer-readable program code.

Furthermore, these computer program instructions, such as embodied in computer-readable program code, may also be stored in one or more computer-readable memory or memory devices that can direct a computer processor or other programmable processing apparatus to function in a particular manner, such that the instructions stored in the computer-readable memory or memory devices produce an article of manufacture including instruction means which implement the function specified in the block(s) of the flowchart(s). The computer program instructions may also be executed by a computer processor or other programmable processing apparatus to cause a series of operational steps to be performed on the computer processor or other programmable processing apparatus to produce a computer-implemented process such that the instructions which execute on the computer processor or other programmable processing apparatus provide steps for implementing the functions specified in the block(s) of the flowchart(s), procedure (s) algorithm(s), step(s), operation(s), formula(e), or computational depiction(s).

It will further be appreciated that the terms "programming" or "program executable" as used herein refer to one or more instructions that can be executed by one or more computer processors to perform one or more functions as described herein. The instructions can be embodied in software, in firmware, or in a combination of software and firmware. The instructions can be stored local to the device in non-transitory media, or can be stored remotely such as on a server, or all or a portion of the instructions can be stored locally and remotely. Instructions stored remotely can be downloaded (pushed) to the device by user initiation, or automatically based on one or more factors.

It will further be appreciated that as used herein, that the terms processor, hardware processor, computer processor, central processing unit (CPU), and computer are used synonymously to denote a device capable of executing the instructions and communicating with input/output interfaces and/or peripheral devices, and that the terms processor, hardware processor, computer processor, CPU, and computer are intended to encompass single or multiple devices, single core and multicore devices, and variations thereof.

From the description herein, it will be appreciated that the present disclosure encompasses multiple embodiments which include, but are not limited to, the following:

1. An apparatus for localizing an arc inside a radio-frequency (RF) waveguide, comprising: (a) multiple sound vibration transducers, comprising at least one pair of said sound vibration transducers, configured for coupling to positions within an RF waveguide; (b) a data acquisition circuit coupled to said multiple sound vibration transducers and configured for collecting sound vibration information from said multiple sound vibration transducers; (c) a circuit for generating a trigger signal when a threshold level of voltage standing wave ratio (VSWR) is exceeded; (d) a processor; and (e) a non-transitory memory storing instructions executable by the processor; (f) wherein said instructions, when executed by the processor, perform steps comprising: (f)(i) receiving a trigger from said circuit for generating a trigger signal upon exceeding the threshold level of voltage standing wave ratio (VSWR); (f)(ii) processing sound vibration information collected from said multiple sound vibration transducers by said data acquisition circuit during a period of time proximal said trigger; (f)(iii) determining time-of-flight values for each of the sound vibration transducers within said multiple sound vibration transducers; (f)(iv) comparing data measured from each pair of sound vibration transducers within said multiple sound vibration transducers, and identifying a faster longitudinal component and recording time required for sound to reach the transducer pair; and (f)(v) comparing respective time-of-flights for each of the sound vibration transducers with speed of sound in for material comprising the RF waveguide and generating longitudinal position of an arc associated with the high VSWR condition.

2. A method for localizing an arc inside a radio frequency (RF) waveguide, the method comprising: (a) collecting sound vibration data from at least one pair of sound vibration transducers coupled within an RF waveguide; (b) detecting a high voltage standing wave ratio (VSWR) in the RF waveguide to which are coupled the sound vibration transducers; (c) processing data from the sound vibration transducers in response to detecting the high voltage standing wave ratio (VSWR) condition; (d) measuring time-of-flight for the sound vibration transducers; (e) comparing data measured from each pair of sound vibration transducers within a processing device, identifying a faster longitudinal component and recording time required for sound to reach each pair of sound vibration transducers; and (f) comparing respective time of flights (TOFs) for the sound vibration transducers, with speed of sound in material of the RF waveguide, and generating information on the longitudinal position in the RF waveguide of an arc associated with the high VSWR condition.

3. A method for localizing an arc inside a radio-frequency (RF) waveguide, the method comprising: (a) placing a first pair of sound vibration transducers on an RF waveguide in a first location in a general area where suspected arcing occurs; (b) placing a second pair of sound vibration transducers on an RF waveguide in a second location in a general area where suspected arcing occurs; (c) wherein a first sound vibration transducer in the first sound vibration transducer pair is placed at the approximate center of a first face of the RF waveguide, wherein a second sound vibration transducer in the first sound vibration transducer pair is placed at the approximate center of a second face of the RF waveguide, and wherein said first and second faces of the RF waveguide are perpendicular; (d) wherein a first sound vibration transducer in the second sound vibration transducer pair is placed at the approximate center of the first face of the RF waveguide, and wherein a second sound vibration transducer in the second sound vibration transducer pair is placed at the approximate center of the second face of the RF waveguide; (e) detecting a high voltage standing wave ratio (VSWR) in the RF waveguide; (f) acquiring data from the sound vibration transducers when the high VSWR is detected; (g) measuring time-of-flight for the sound vibration transducers, wherein in each transducer pair, the first signal to arrive at a sound vibration transducer will be a longitudinal mode, indicating angular position of the arcing; (h) comparing data from each sound vibration transducer pair, and from that comparison identifying the faster longitudinal component and recording the time required for the sound to reach the transducer pair; and (i) comparing the respective time of flights for the sound vibration transducers, and speed of sound in the RF waveguide material, and from that comparison identifying longitudinal position of the arc.

4. A method for localizing an arc inside a radiofrequency (RF) waveguide, the method comprising using piezoelectric transducers to localize arcing inside the RF waveguide based on acoustic time-of-flight and vibrational mode discrimination.

5. The apparatus or method of any preceding embodiment, wherein said sound vibration transducers comprise piezoelectric transducers.

6. The apparatus or method of any preceding embodiment, wherein each pair of sound vibration transducers is placed with a first sound vibration transducer at the approximate center of a first face of the RF waveguide, while a second sound vibration transducer is placed at the approximate center of a second face of the RF waveguide, and wherein said first face and said second face of the RF waveguide are perpendicular.

7. The apparatus or method of any preceding embodiment, wherein said instructions when executed by the processor perform steps comprising generating longitudinal position of the arc information regardless of the angular location of the arc within the RF waveguide.

8. The apparatus or method of any preceding embodiment, wherein said instructions when executed by the processor further perform steps comprising collecting information on the RF waveguide into which said multiple sound vibration transducers are coupled and performing a calibration process to create a set of baseline information for use when generating information on longitudinal position of the arc when the network is operating.

9. The apparatus or method of any preceding embodiment, wherein said sound vibration transducers comprise piezoelectric transducers.

10. The apparatus or method of any preceding embodiment, wherein each pair of sound vibration transducers in the at least one pair of sound vibration transducers, is placed with a first sound vibration transducer at the approximate center of a first face of the RF waveguide, while a second sound vibration transducer is placed at the approximate center of a second face of the RF waveguide, and wherein said first face and said second face of the RF waveguide are perpendicular.

11. The apparatus or method of any preceding embodiment, wherein said information on the longitudinal position of the arc is generated regardless of the angular location of the arc within the RF waveguide.

12. The apparatus or method of any preceding embodiment, further comprising collecting information on the RF waveguide into which the at least one pair of sound vibration transducers are coupled and performing a calibration process to create a set of baseline information for use when generating information on longitudinal position of the arc when the RF waveguide.

13. The apparatus or method of any preceding embodiment, wherein the sound vibration transducers comprise piezoelectric transducers.

14. The apparatus or method of any preceding embodiment, wherein each pair of sound vibration transducers is placed with a first sound vibration transducer at the approximate center of a first face of the RF waveguide, while a second sound vibration transducer is placed at the approximate center of a second face of the RF waveguide, and wherein said first face and said second face of the RF waveguide are perpendicular.

15. The apparatus or method of any preceding embodiment, wherein said information on the longitudinal position of the arc is generated regardless of the angular location of the arc within the RF waveguide.

16. The apparatus or method of any preceding embodiment, further comprising collecting information on the RF waveguide into which the at least one pair of sound vibration transducers are coupled and performing a calibration process to create a set of baseline information for use when generating information on longitudinal position of the arc when the RF waveguide.

As used herein, the singular terms "a," "an," and "the" may include plural referents unless the context clearly dictates otherwise. Reference to an object in the singular is not intended to mean "one and only one" unless explicitly so stated, but rather "one or more."

As used herein, the term "set" refers to a collection of one or more objects. Thus, for example, a set of objects can include a single object or multiple objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. An apparatus for localizing an arc inside a radio-frequency (RF) waveguide, comprising:
   (a) multiple sound vibration transducers, comprising two pair of said sound vibration transducers, configured for coupling to positions within an RF waveguide;
   (b) wherein a first pair of sound vibration transducers are positioned in the RF waveguide at a first location in a general area where suspected arcing occurs, and a second pair of sound vibration transducers are positioned in the RF waveguide at a second location in a general area where suspected arcing occurs;
   (c) wherein a first sound vibration transducer in the first sound vibration transducer pair is placed at an approximate center of a first face of the RF waveguide, and a second sound vibration transducer of the first sound vibration transducer pair is placed at an approximate center of a second face of the RF waveguide, and wherein said first and second faces of the RF waveguide are perpendicular; and
   wherein a first sound vibration transducer in the second sound vibration transducer pair is placed at an approximate center of a first face of the RF waveguide, and a second sound vibration transducer of the second sound vibration transducer pair is placed at an approximate center of a second face of the RF waveguide, and wherein said first and second faces of the RF waveguide are perpendicular;
   (d) a data acquisition circuit coupled to said multiple sound vibration transducers and configured for collecting sound vibration information from said multiple sound vibration transducers;
   (e) a circuit for generating a trigger signal when a threshold level of voltage standing wave ratio (VSWR) is exceeded;
   (f) a processor; and
   (g) a non-transitory memory storing instructions executable by the processor;
   (h) wherein said instructions, when executed by the processor, perform steps comprising:
      (i) detecting a high voltage standing wave ratio (VSWR) in the RF waveguide;
      (ii) acquiring data from the sound vibration transducers when the high VSWR is detected;
      (iii) measuring time-of-flight for the sound vibration transducers, wherein in each transducer pair, the first signal to arrive at a sound vibration transducer will be a longitudinal mode, indicating angular position of the arcing;
      (iv) comparing data from each sound vibration transducer pair, and from that comparison identifying the faster longitudinal component and recording the time required for the sound to reach the transducer pair; and
      (v) comparing the respective time of flights for the sound vibration transducers, and speed of sound in the RF waveguide material, and from that comparison identifying longitudinal position of the arc.

2. The apparatus of claim 1, wherein said sound vibration transducers comprise piezoelectric transducers.

3. The apparatus of claim 1, wherein said instructions when executed by the processor perform steps comprising generating said longitudinal position of the arc regardless of the angular location of the arc within the RF waveguide.

4. The apparatus of claim 1, wherein said instructions when executed by the processor further perform steps comprising collecting information on the RF waveguide into which said multiple sound vibration transducers are coupled and performing a calibration process to create a set of baseline information for use when generating said longitudinal position of the arc when the network is operating.

5. A method for localizing an arc inside a radio-frequency (RF) waveguide, the method comprising:
   (a) placing a first pair of sound vibration transducers on an RF waveguide in a first location in a general area where suspected arcing occurs;
   (b) placing a second pair of sound vibration transducers on an RF waveguide in a second location in the general area where suspected arcing occurs;
   (c) wherein a first sound vibration transducer in the first sound vibration transducer pair is placed at an approximate center of a first face of the RF waveguide, wherein a second sound vibration transducer in the first sound vibration transducer pair is placed at an approximate center of a second face of the RF waveguide, and wherein said first and second faces of the RF waveguide are perpendicular;
   (d) wherein a first sound vibration transducer in the second sound vibration transducer pair is placed at the approximate center of the first face of the RF waveguide, and wherein a second sound vibration transducer in the second sound vibration transducer pair is placed at the approximate center of the second face of the RF waveguide;
   (e) detecting a high voltage standing wave ratio (VSWR) in the RF waveguide;
   (f) acquiring data from the sound vibration transducers when the high VSWR is detected;
   (g) measuring time-of-flight for the sound vibration transducers, wherein in each transducer pair, the first signal to arrive at a sound vibration transducer will be a longitudinal mode, indicating angular position of the arcing;
   (h) comparing data from each sound vibration transducer pair, and from that comparison identifying the faster longitudinal component and recording the time required for the sound to reach the transducer pair; and
   (i) comparing the respective time of flights for the sound vibration transducers, and speed of sound in the RF waveguide material, and from that comparison identifying longitudinal position of the arc.

6. The method of claim 5, wherein the sound vibration transducers comprise piezoelectric transducers.

7. The method of claim 5, wherein said information on the longitudinal position of the arc is generated regardless of the angular location of the arc within the RF waveguide.

8. The method of claim 5, further comprising collecting information on the RF waveguide into which the at least one pair of sound vibration transducers are coupled and performing a calibration process to create a set of baseline information for use when generating said longitudinal position of the arc within the RF waveguide.

* * * * *